(12) United States Patent
Oddoart (10) Patent No.: US 8,797,009 B2
(45) Date of Patent: Aug. 5, 2014

(54) AUTO CASCODE BUCK VOLTAGE CONVERTER

(75) Inventor: Ludovic Oddoart, Le Rouret (FR)

(73) Assignee: CSR Technology Inc., San Jose, CA (US)

( * ) Notice: Subject to any disclaimer, the term of this patent is extended or adjusted under 35 U.S.C. 154(b) by 455 days.

(21) Appl. No.: 12/830,671

(22) Filed: Jul. 6, 2010

(65) Prior Publication Data

US 2012/0007572 A1    Jan. 12, 2012

(51) Int. Cl.
*G05F 1/00*    (2006.01)
*H02M 3/156*    (2006.01)

(52) U.S. Cl.
USPC .......................................... 323/282; 323/351

(58) Field of Classification Search
USPC ................... 323/282, 283, 284, 351, 267, 268
See application file for complete search history.

(56) References Cited

U.S. PATENT DOCUMENTS

| | | | | |
|---|---|---|---|---|
| 5,604,449 | A | * | 2/1997 | Erhart et al. ..................... 326/81 |
| 5,962,987 | A | * | 10/1999 | Statnic ........................... 315/248 |
| 6,069,492 | A | * | 5/2000 | Sher et al. ........................ 326/71 |
| 6,603,671 | B2 | * | 8/2003 | Tokunaga et al. ............... 363/17 |
| 7,701,263 | B2 | * | 4/2010 | Kumar et al. .................. 327/108 |
| 2002/0190793 | A1 | * | 12/2002 | Moon ............................ 330/253 |
| 2008/0231244 | A1 | * | 9/2008 | Yamada ........................ 323/282 |

OTHER PUBLICATIONS

Buck Converter, http://en.wikipedia.org/wiki/Buck_converter downloaded Jan. 13, 2010, pp. 1-12.
Switching Regulators, http://www.national.com/appinfo/power/files/f5.pdf downloaded Apr. 2010, pp. 30-62.

* cited by examiner

*Primary Examiner* — Matthew Nguyen
*Assistant Examiner* — Trinh Dang
(74) *Attorney, Agent, or Firm* — Ratner Prestia (57) ABSTRACT

A voltage converter includes a power switch having respective charging and discharging control terminals, and an output terminal coupled to a series connected inductor and capacitor. The voltage converter also includes a charging switch coupled to the charging control terminal of the power switch, a discharging switch coupled to the discharging control terminal of the power switch, and a feedback circuit coupling the power switch, charging switch and discharging switch to a node at which the capacitor and inductor are connected. During a charging phase, the charging switch couples the capacitor to the charging control terminal of the power switch, and during a discharging phase, the discharging switch couples the capacitor to the discharging control terminal of the power switch.

22 Claims, 7 Drawing Sheets

FIG. 7

AUTO CASCODE BUCK VOLTAGE CONVERTER

FIELD OF INVENTION

The present invention relates, in general, to an auto cascode Buck voltage converter and in particular to a Buck switching power supply that employs a feedback loop to control output current responsive to a voltage across an output capacitor.

BACKGROUND OF THE INVENTION

In conventional systems, Buck switchers include switches which charge an output inductor and capacitor. These switches (commonly made using PMOS and NMOS transistors) have limited voltage robustness when implemented using high integration technology nodes. Therefore, the switches are usually cascoded to handle high voltage values (e.g. battery voltages). In general, a standard regulator is included in these circuits to create the voltage required to bias the cascode devices. The conventional cascode regulator also requires an additional capacitor (other than the output capacitor) which increases the overall size of the voltage converter. Furthermore, the cascode regulator provides unwanted current paths from the battery to ground which contribute to power loss.

SUMMARY OF THE INVENTION

To meet this and other needs, and in view of its purposes the present invention provides a voltage converter which includes a power switch coupled between battery potential and a source of reference operating potential (e.g. ground), having respective charging and discharging control terminals, and having an output terminal. The output terminal of the power switch is coupled to one end of a series connected inductor and capacitor, the other end of which is connected to a source of reference operating potential. The voltage converter also includes a charging switch coupled to the charging control terminal of the power switch, a discharging switch coupled to the discharging control terminal of the power switch, and a feedback circuit coupling the power switch, charging switch and discharging switch to a node at which the capacitor and inductor are connected. During a charging phase, the charging switch electrically couples the capacitor to the charging control terminal of the power switch, and during a discharging phase, the discharging switch electrically couples the capacitor to the discharging control terminal of the power switch.

It is understood that the foregoing general description and the following detailed description are exemplary, but are not restrictive, of the invention.

DETAILED DESCRIPTION OF THE INVENTION

As described below, the present invention provides a Buck voltage converter for converting a battery supply voltage to a reduced voltage thereby powering various low voltage circuits. The voltage converter includes a controllable startup regulator which is shut down after pre-charging the output capacitor to reduce power loss. The voltage converter also includes a feedback circuit connecting the output capacitor with the startup regulator and charging/discharging switches and power switches to reduce power loss. Using the present invention, the physical size of a Buck voltage converter may be reduced, while increasing power efficiency.

Figure 1:
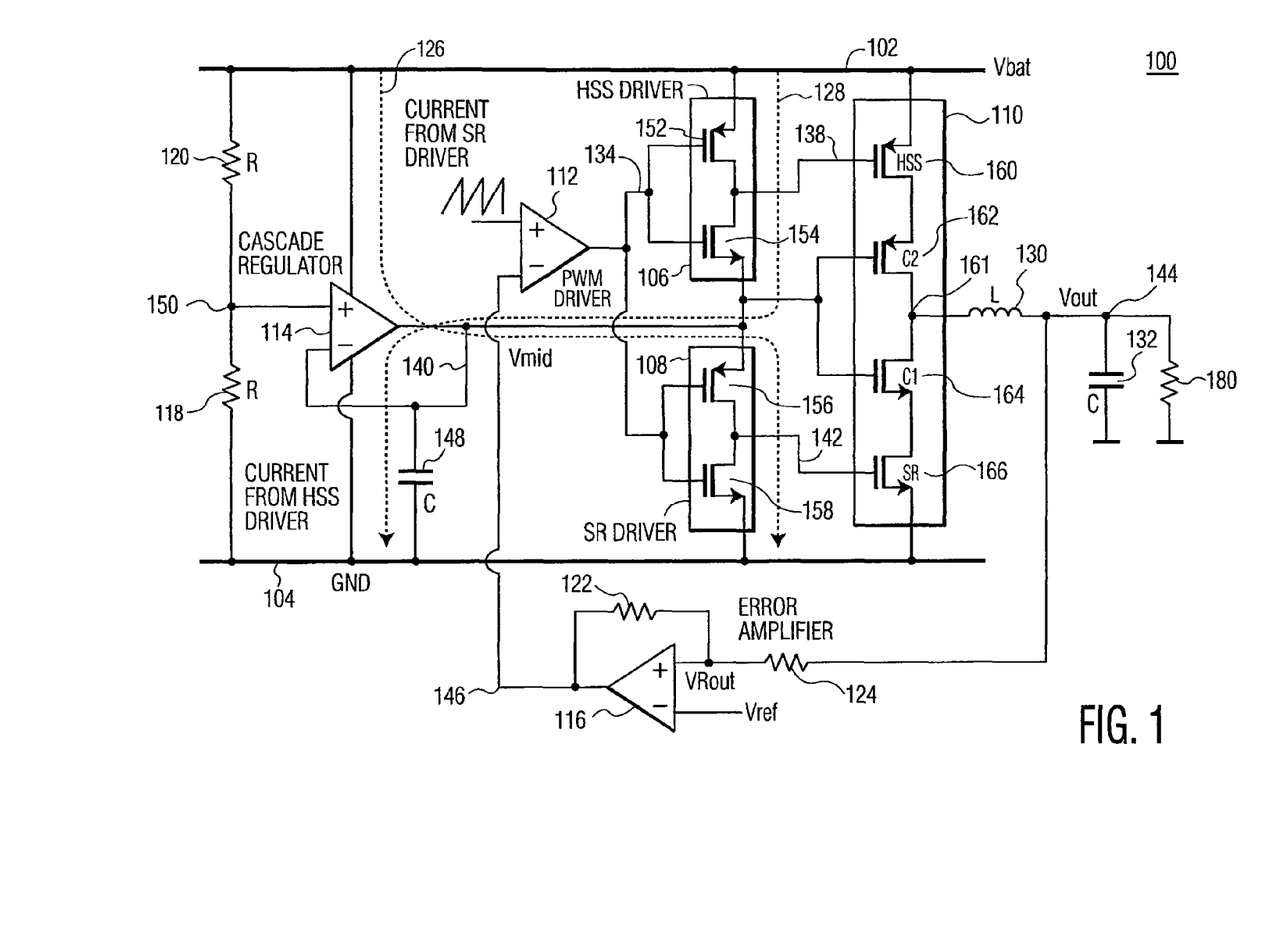
FIG. 1 is a circuit diagram of a Buck voltage converter with a cascode regulator, according to an embodiment of the present invention.

Shown in FIG. 1 is voltage converter 100 including pulse width modulation (PWM) driver 112, high side switch (HSS) 106 (charging switch), synchronous rectifier (SR) 108 (discharging switch), power switch 110, cascode regulator 114 and error amplifier 116. Voltage converter 100 also includes impedance elements 118, 120, 122 and 124, regulator capacitor 148, output inductor 130 and output capacitor 132. In general, the switches throughout the various embodiments described below may include metal oxide semi-conductor field effect transistors (MOSFET) or any other type of transistors.

In general, PWM driver 112 controls charging switch 106 and discharging switch 108 through output node 134. PWM driver 112 compares an error signal produced by error amplifier 116 with a sawtooth waveform (e.g. intersective method) to produce a PWM signal having a variable length on and off period for controlling the switches. Cascode regulator 114 is configured as a voltage follower to maintain a midlevel voltage Vmid between two voltage potentials (e.g. between battery voltage Vbat and a source of reference operating potential e.g. ground (GND)) at node 140. Vmid allows switch 106 to be driven between Vbat and Vmid and switch 108 to be driven between Vmid and GND. This arrangement limits the voltage swing across P-Type power switch (160) and N-Type power switch (166) so that the maximum voltage ratings of the technology are not exceeded. In general, when controlled by PWM driver 112, switch 106 and switch 108 alternately control power switch 110 through output nodes 138 and 142 respectively. This alternating switching behavior provides both a charging and discharging phase for inductor 130, where the resulting inductor current is re-circulated into output capacitor 132, thereby efficiently reducing Vbat to a lower voltage, Vout, on node 144 that is applied to load 180.

During operation of voltage converter 100, cascode regulator 114 (configured as a voltage follower) applies a mid level voltage Vmid to the gates of transistors 162 and 164, as well as to the source and drain of transistors 154 and 156 respectively. The output voltage Vmid follows the reference voltage applied to non-inverting terminal 150. In general, the impedance values of 118 and 120 (configured as a voltage divider) provide a desired Vmid voltage on terminal 150. Capacitor 148 is also connected to node 140 to maintain a constant Vmid voltage. Vmid is a midlevel voltage that allows charging switch 106 and discharging switch 108 to be driven between an appropriate voltage differential (e.g. Vbat-Vmid and Vmid-GND respectively).

During operation of the voltage converter, there are two phases (Phase 1 and Phase 2). Phase 1 is a charging phase where current from Vbat is accumulated in inductor 130 as a magnetic field. Phase 2 is a discharging phase where excess current in the inductor 130 is shunted to ground. During both Phase 1 and Phase 2, the voltage converter delivers the energy stored in the inductor 130 and capacitor 132 to load 180. In general, capacitor 132 acts as a filter so voltage Vout remains constant across load 180.

During phase 1 (charging phase), PWM driver 112 applies a logic high signal to node 134 of charging switch 106 and discharging switch 108, thereby turning on transistors 154 and 158 while turning off transistors 152 and 156. In response to the logic high signal, transistor 154 applies Vmid to the gate of transistor 160. Because Vmid is also applied to the gates of both transistors 160 and 162, current from Vbat is conducted through transistors 160 and 162 to inductor 130. Also, since transistor 162 is a cascode device, the drain to source voltage of transistor 160 is maintained at a sufficiently low value during charging. Similarly, in response to the logic high signal, transistor 158 applies GND to gate 142 of transistor 166. Since Vmid is applied to the gate of transistor 164, and GND is applied to the gate of transistor 166, the current flowing from Vbat to the inductor is blocked from flowing to GND while maintaining a sufficiently low drain to source voltage on transistor 166.

During Phase 2 (discharging phase), PWM driver 112 applies a logic low signal to node 134, thereby turning on transistors 152 and 156, while turning off transistors 154 and 158. In response to the logic low signal, transistor 152 applies Vbat to node 138, thereby turning off transistor 160, while transistor 156 applies Vmid to node 142 thereby turning on transistor 166. In this configuration, the inductor is connected to GND 104 through transistors 164 and 166, while being disconnected from Vbat 102. The energy accumulated in inductor 130 during Phase 1 is then delivered (discharged) through load 180 if the voltage at node 161 is greater than Vmid by at least the threshold voltage.

The duration of phase 1 and phase 2 is controlled by an error signal provided by error amplifier 116. Error amplifier 116 is configured with impedance elements 122 and 124 to subtract a predetermined reference voltage Vref (e.g. 1.2 v) from a signal Vrout at the junction of transistors 122 and 124 which is derived from Vout. With no load on the regulator, this signal is ideally the same as Vref. This subtraction produces an error signal on node 146 which is input to the PWM driver. PWM driver 112 then compares the error signal to a saw tooth waveform on the inverting terminal to determine the respective durations of phase 1 and phase 2. For example, if Vrout is less than Vref, a negative error signal may cause PWM driver 112 to provide phase 1 pulses which are wider than the phase 2 pulses, thereby charging the inductor. Likewise, if Vrout is greater than or equal to Vref, a positive error signal may cause PWM driver 112 to provide phase 2 pulses which are wider than the phase 1 pulses, thereby discharging the inductor. If Vout and Vref are equal to each other, then phase 1 and phase 2 pulses may have the same duration.

Figure 2:
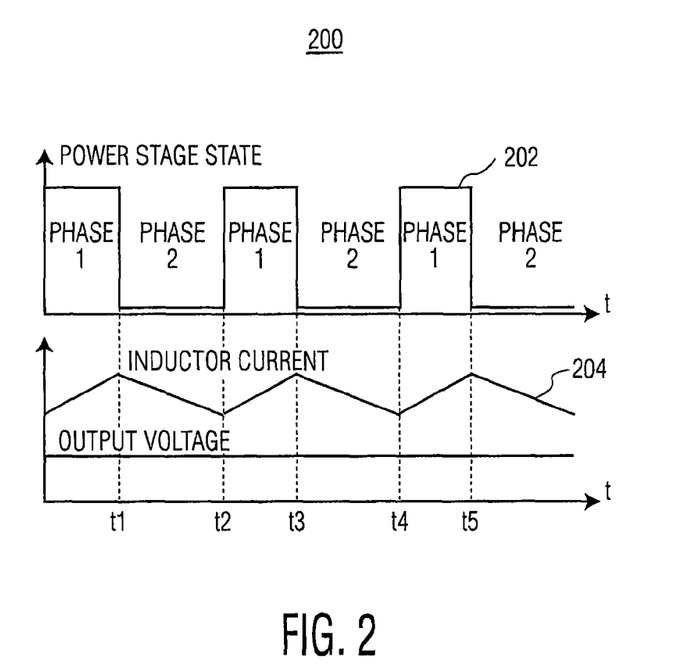
FIG. 2 is a timing plot of an inductor current and a capacitor voltage with respect to a charging and discharging phase of the voltage converter, according to an embodiment of the present invention.

FIG. 2 shows a plot of the inductor current and capacitor voltage with respect to an alternating phase 1 and phase 2. In FIG. 2, it is shown that during phase 1, the inductor current is increasing (the inductor is being charged by the battery). During phase 2, however, the inductor current is decreasing (the inductor is discharging through transistors 164 and 166). Even though the current through the inductor is increasing and decreasing during the alternating phases, the output voltage Vout remains constant over time due to output capacitor 132.

In order to maintain a constant and reliable Vmid voltage without experiencing fast transients when switching power devices 106, 108 and 110, Vmid regulator 114 shown in the FIG. 1 may employ a bypass capacitor 148. An external on-board capacitor or a silicon integrated capacitor may be used. In general, however, this capacitor increases the size and cost of the overall voltage converter.

Figure 3:
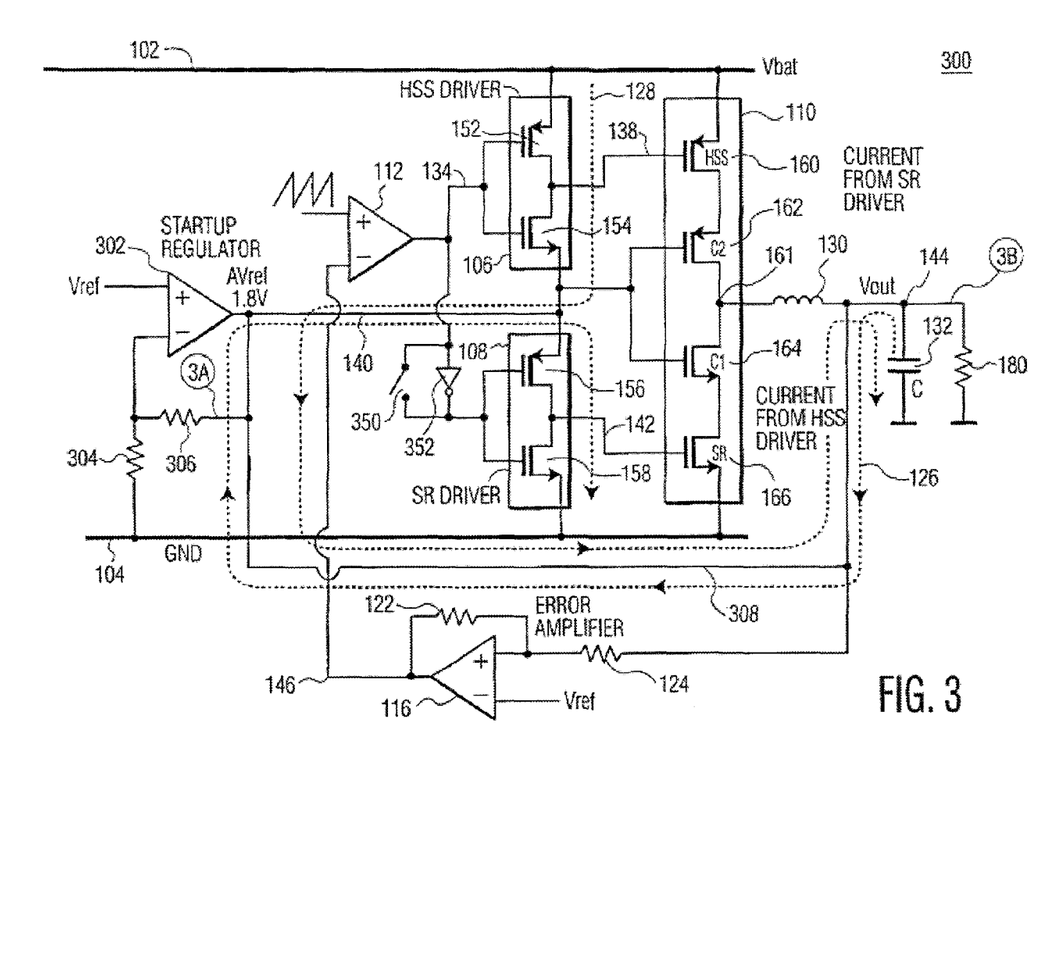
FIG. 3 is a circuit diagram of a voltage converter with a startup regulator and feedback loop, according to an embodiment of the present invention.

In many applications, it may be beneficial to decrease the size and increase the power efficiency of the Buck voltage converter. Shown in FIG. 3, is a voltage converter 300 that includes a startup regulator (which may be turned on or off) and a feedback loop. In general, cascode regulator 114, impedance elements 118 and 120, and capacitor 148 of voltage converter 200 are excluded from the voltage converter 300, while startup regulator 302 and impedance elements 304 and 306 are included. Also, voltage converter 300 includes feedback circuit 308 connecting the output terminal of startup regulator 302 with output terminal 144.

In general, feedback circuit 308, provides a connection between output capacitor 132 and startup regulator 302. During a pre-charging phase, startup regulator 320 is turned on to pre-charge capacitor 132 to output voltage Vout (e.g 1.8 v). During pre-charging, switch 110 is turned off (high impedance state) while the capacitor is pre-charging. To turn off switch 110 (isolate the inductor from both Vbat and GND), a logic low signal is applied to node 134. The logic low signal turns off transistor 160 by coupling node 138 to Vbat through transistor 152 (i.e. the gate to source voltage Vgs of transistor 160=0 v). The logic low signal is also converted into a logic high signal by inverter 352 (switch 350 is opened during pre-charging phase). The logic high signal output by inverter 352 then turns off transistor 166 by coupling node 142 to GND through transistor 158 (i.e. Vgs of transistor 166=0 v). During pre-charging, load 180 may also be decoupled from the capacitor by opening a switch (not shown) between node 3B and the load 180 (this may decrease the duration of the pre-charging phase).

In general, the duration of the pre-charging phase is dictated by the size of the output capacitor and the current capability of the startup regulator. For example, if an output capacitor requiring a 1.8 v charge has a capacitance of 2.2 uF, and the regulator current capability is 5 ma, then the duration of pre-charge may be approximately 1 ms long. When pre-charging the capacitor is complete, the startup regulator 302 is turned off (high impedance state) while switches 106, 108 and 110 are turned on (phase 1 and phase 2 begin alternating).

During switching operation (i.e. during phase 1 and phase 2), switch 350 is closed (shunting inverter 352 out of the circuit) and startup regulator 302 is turned off (high impedance state). A switch (not shown) between node 3A and the resistor 306 may also be opened to decouple elements 304 and 306 from the circuit so that current flowing through the feedback circuit is not lost to GND. In general, during switching, the Buck voltage converter alternately charges and discharges inductor 130 (see description of FIG. 1). In Buck converter 300, capacitor 132 provides the bias voltage on cascode transistors 162 and 164, as well as a mid-level voltage (e.g 1.8 v) between the charging and discharging switches. In this embodiment, during phase 1, current 128 (current flowing through charging switch 106) is routed through feedback circuit 308 to charge capacitor 132 (the current is not lost to GND through the startup regulator or impedance elements). Also, during phase 1, current 126 (current flowing through discharging switch 108) is generated from the output capacitor voltage and delivered through feedback circuit 308. Although current 126 from capacitor 132 is lost to GND, it is not as significant as the Vbat supply current and Vmid regulator current lost to GND in the circuit of FIG. 1. In general current paths 126 and 128 in FIG. 3 help increase power efficiency of the Buck voltage converter during phase 1 and phase 2. Specifically, electric current flowing through the switches is not lost to GND through the startup regulator or the impedance elements, because the startup regulator is turned off (high impedance state) and the impedance elements may be decoupled during the charging and discharging phases. Furthermore, capacitor 132 acts as both an output capacitor to regulate the output voltage as well as a biasing capacitor providing a mid-level voltage to switches 106, 108 and 110. Because capacitor 132 performs dual operations, the voltage converter does not require an additional capacitor, thereby decreasing the overall size of the Buck converter.

Figure 4:
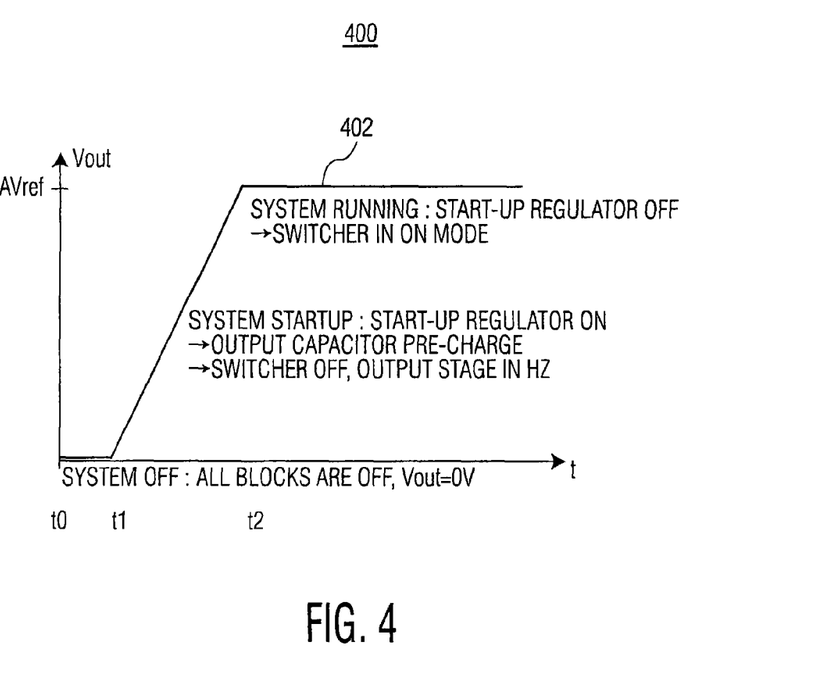
FIG. 4 is a plot of an output capacitor voltage during a pre-charging and voltage regulating sequence, according to an embodiment of the present invention.
Figure 5:
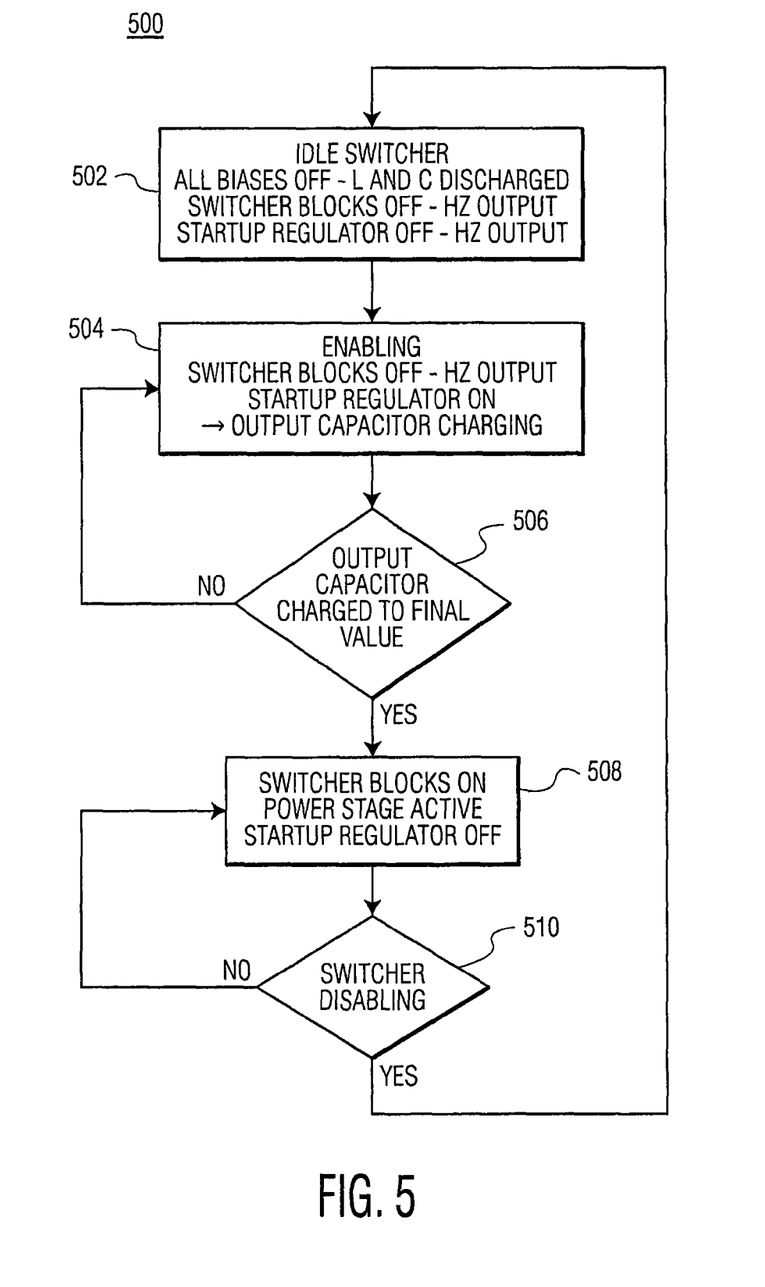
FIG. 5 is a flow chart describing the operation of the voltage converter in FIG. 4, according to an embodiment of the present invention.

FIG. 4 shows a plot 400 of the output voltage Vout 402 of voltage converter 300 during both the pre-charging and charging/discharging phases, while FIG. 5 shows a flow chart of the operation of voltage converter 300. In step 502, the voltage converter is in an idle state where switch 110 and regulator 302 are turned off and forced into a high impedance (HZ) output state by a processor (not shown) and both the inductor and capacitor are discharged. The output voltage during step 502 is shown between times t0 and t1 in FIG. 4 where Vout is approximately 0 volts.

In step 504, the voltage converter is in the pre-charging phase where the startup regulator is turned on by the processor to pre-charge the output capacitor, while switch 110 remains turned off. The output voltage during step 504 is shown between times t1 and t2 in FIG. 4 where Vout increases from approximately 0 volts to an amplified Vref (AVref) (e.g. 1.8 v). In general, Vref may be provided by a bandgap reference voltage source (e.g. 1.2 v).

In step 506 a comparator (not shown) determines if Vout has reached AVref (the capacitor is fully pre-charged). If Vout has not reached AVref, then the pre-charging phase in step 504 is continued. If Vout has reached AVref, then the operation moves on to step 508 (phase 1/phase 2). During step 508, the processor turns off regulator 302. This enables voltage converter 300 to begin the PWM switching operation. The output voltage during step 508 is shown from time t2 onward in FIG. 4 where Vout is maintained at AVref.

In step 510, it is determined if voltage converter 300 has been disabled. If voltage converter 300 has not been disabled, then phase 1 and phase 2 in step 508 continue. If, however, voltage converter 300 has been disabled, then phase 1 and phase 2 are stopped, and voltage converter 300 returns to the idle state in step 502.

In some applications, battery voltage may have a specified extended range below 3.3 v (e.g. down to 2.3 v) which may be too low to drive power switch 160 during the charging phase. For example, if the battery voltage is 2.3 v and Vout is 1.8 v then the gate to source voltage across transistor 160 (e.g. 0.5 v) may be less than a required gate to source voltage due to a voltage drop across cascode transistor 154. This reduced voltage may be too low to turn on transistor 160 based on the required gate to source voltage for a given type of transistor (e.g. MOSFET, BJT, . . . etc.). Thus, increasing the gate to source voltage across the transistors in power switch 110 may be beneficial to properly operate the voltage converter when the battery voltage becomes too low.

Figure 6:
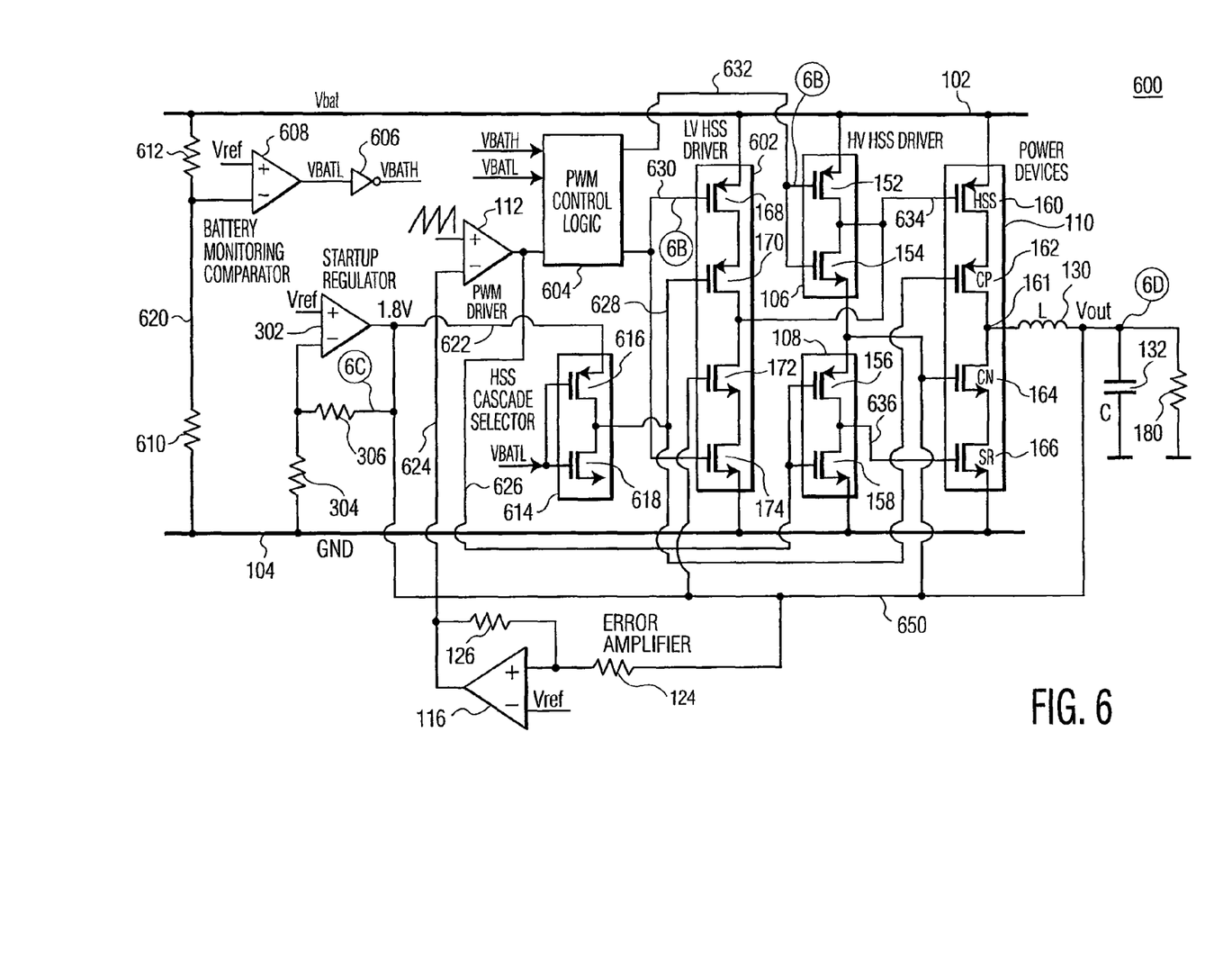
FIG. 6 is a circuit diagram of a voltage converter with a cascode selector, and low voltage and high voltage charging switch, according to an embodiment of the present invention.

FIG. 6 shows a voltage converter 600 that includes additional components for driving the power switch 110 when the battery voltage becomes too low. As compared to voltage converter 300 in FIG. 3, voltage converter 600 in FIG. 6 includes a low voltage (LV) charging switch 602, high voltage (HV) charging switch 106, HSS cascode selector switch 614, PWM controller 604, battery monitor 608 and inverter 606.

In general, the battery voltage signal output by monitor 608 controls PWM logic 604 to select between driving LV switch 602 when the battery voltage is low (e.g. less than 3.3 v) and HV switch 106 when the battery voltage is high (e.g. greater than or equal to 3.3 v). The battery voltage signal also controls cascode selector 614 to select between driving cascode transistors 170 and 162 with GND potential when the battery voltage is too low or with Vout when the battery voltage is high.

Converter 600 may also include inverters (not shown) shunted with switches (not shown) at nodes 6A and 6B respectively in FIG. 6, which are similar to switch 350 and inverter 352 shown in FIG. 3. During phase 1 and phase 2 switching, these switches may be opened and closed to isolate the output terminals of the drivers responsive to the battery voltage being low or high. Also, nodes 6C and 6D may also include switches (not shown) to de-couple impedance elements 304 and 306 and load 180 from the circuit.

During pre-charging of capacitor 132 in converter 600, logic levels on nodes 626, 630 and 632 may be controlled to force the power device 110 into a high impedance state (maintain Vgs=0 v on transistors 160 and 166). Specifically, during pre-charging, nodes 630 and 632 are maintained at a logic low level, while node 626 is maintained at a logic high level. It should be noted that during pre-charging, inverters (not shown) on nodes 6A and 6B are shunted to ensure the proper logic levels on the LV and HV drivers, while the switch (not shown) on node 6D may be opened to decouple load 180 from the circuit to decrease the duration of pre-charging. The switch (not shown) on node 6C is also closed to couple the impedance elements to the circuit. A similar procedure may also be implemented for converter 700 in FIG. 7. In general, capacitor 132 is pre-charged by startup regulator 302 through feedback circuit 650.

During phase 1 (inductor charging phase) in circuit 600, however, inverters (not shown) on nodes 6A and 6B are alternately shunted in response to VBATL and VBATH, as described below, and the switch (not shown) on node 6D is opened to charge/discharge capacitor 132 and deliver power to load 180.

The resistors 610 and 612 are configured as a voltage divider between Vbat and GND to develop a reference battery voltage at node 620. In this example, when the battery voltage is less than 3.3 v, the voltage at node 620 is less than Vref (e.g. 1.2 v). In phase 1, if the voltage at node 620 is greater than Vref (i.e. Vbat is sufficient to turn on transistor 160 when the gate electrode is at Vmid), then monitor 608 outputs a logic low signal (VBATL is set to low and VBATH is set to high). When VBATL is low and VBATH is high, PWM control logic 604 outputs a logic high signal on node 632 and a logic low signal on node 630, to turn on HV charging switch 106 (Vout is driving the gate of transistor 160) and isolate the output of LV charging switch 602. Responsive to VBATH being high, the inverter (not shown) on node 6B is shunted to ensure transistors 152 and 154 receive the same logic low signal to turn on HV charging switch 106, while the inverter (not shown) on node 6A is not shunted to ensure transistors 168 and 174 receive opposite logic signals (168 logic high and 174 logic low) to turn off (isolate the output of) LV charging switch 602. Furthermore, when VBATL is low, cascode selector 614 drives the gates of cascode transistors 170 and 162 with Vout.

During phase 1, however, if the battery voltage at node 620 is less than or equal to Vref (Vbat insufficient to turn on transistor 160 when the gate electrode is at Vmid), then battery monitor 608 outputs a logic high signal (VBATL is set to high and VBATH is set to low). When VBATL is high and VBATH is low, PWM control logic 604 outputs a logic high signal on node 630 and a logic low signal on node 632 to turn on LV charging switch 602 (GND is applied to the gate of transistor 160) and isolate the output of HV charging switch 106. Responsive to VBATL being high, the inverter (not shown) on node 6A is shunted to ensure transistors 168 and 174 receive the same logic high signal to turn on LV charging switch 602, while the inverter (not shown) on node 6B is not shunted to ensure transistors 152 and 154 receive opposite logic signals (152 logic high and 154 logic low) to turn off (isolate the output of) HV charging switch 106. When VBATL is high, cascode selector 614 also drives the gates of cascode transistors 170 and 162 with GND. Applying a GND potential to transistor 160 through LV charging switch 602 provides a sufficient gate to source voltage across transistor 160, even though the battery voltage is low (e.g. battery 2.3 v–GND 0 v=2.3 v gate to source potential). Similarly, applying a GND potential to cascode transistors 170 and 162 minimizes the impedance through LV charging switch 602 and power switch 110.

Figure 7:
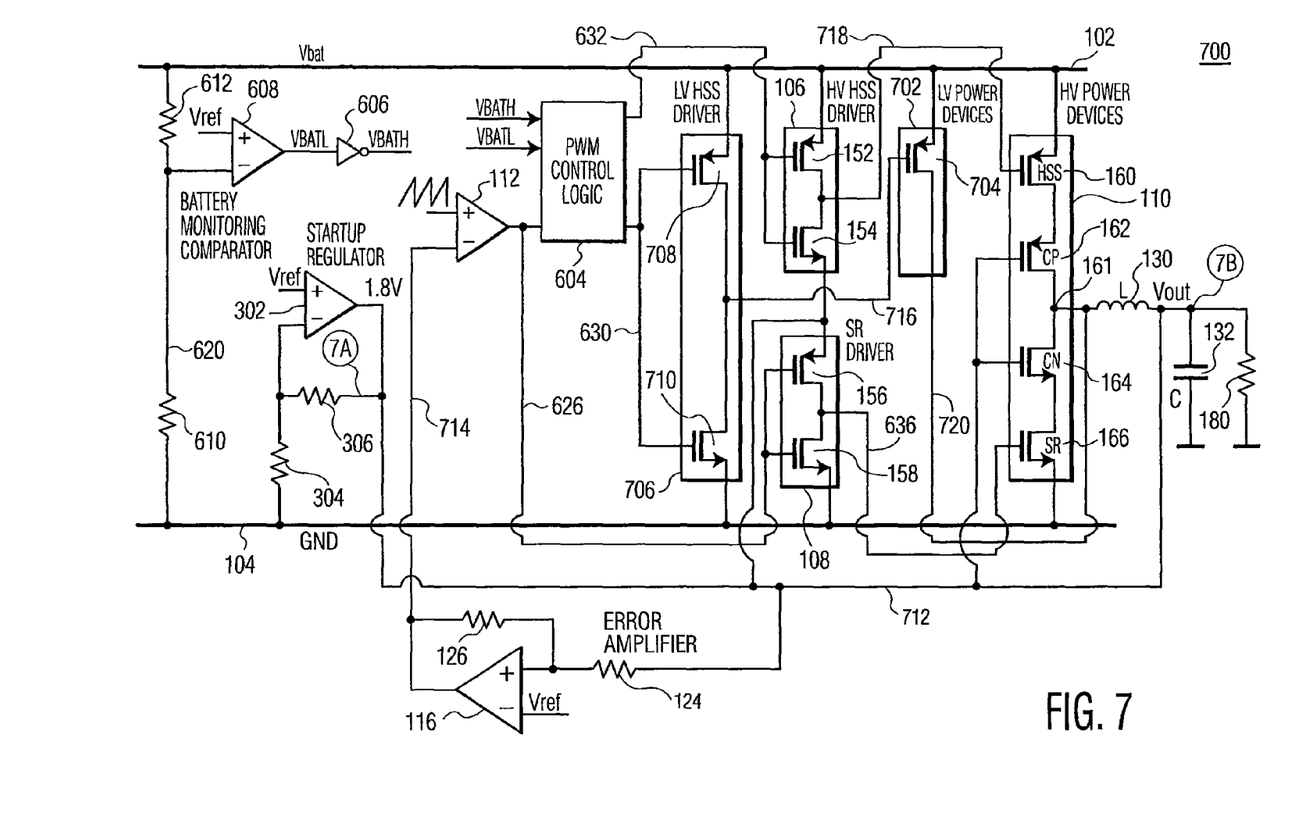
FIG. 7 is a circuit diagram of a voltage converter with a low voltage and high voltage charging switch, and a low voltage and high voltage power switch, according to an embodiment of the present invention.

Instead of including cascode selector 614 in the voltage converter, two separate HSS charging switches and HSS power switches may be alternatively used as shown in FIG. 7. As compared to voltage converter 600 in FIG. 6, voltage converter 700 in FIG. 7 includes separate LV and HV HSS charging switches 706 and 106, as well as separate LV and HV HSS power switches 702 and 110. It is noted that cascode transistors 170 and 172 in LV HSS charging switch 602 are not included in LV HSS charging switch 706 to reduce the impedance in low voltage conditions. In general, when the battery voltage is high (Vbat sufficient to turn on transistor 160), HV HSS charging switch 106 drives HV power switch 110 to charge inductor 130. When the battery voltage is low (Vbat insufficient to turn on transistor 160), however, LV HSS charging switch 706 drives LV power switch 702 to charge inductor 130. It is noted that switches (not shown) on nodes 7A and 7B in FIG. 7 are controlled similarly to the switches (not shown) on nodes 6C and 6D described above with reference to FIG. 6.

During phase 1 (inductor charging phase), if the battery voltage at node 620 is greater than or equal to Vref (Vbat sufficient to drive transistor 160), then monitor 608 outputs a logic low signal (VBATL is set to low and VBATH is set to high). When VBATL is low and VBATH is high, PWM control logic 604 outputs a logic high signal on node 632 to turn on HV power switch 110 (Vout is driving the gate of transistor 160), while turning off LV power switch 702 with a logic low signal on node 630 (node 716 is pulled to Vbat). In this implementation, HV charging switch 106 drives HV power device 110 to charge the inductor 130.

During phase 1, however, if the battery voltage at node 620 is less than Vref (Vbat insufficient to drive transistor 160), then monitor 608 outputs a logic high signal (VBATL is set to high and VBATH is set to low). When VBATL is high and VBATH is low, PWM control logic 604 outputs a logic high signal on node 630 to turn on LV power switch 702 (GND is driving the gate of transistor 704), while turning off HV power switch 110 with a logic low signal on node 632 (node 718 is pulled to Vbat). Thus, in this implementation, LV HSS charging switch 706 drives LV power device 702 to charge the inductor. In general, the absence of cascode transistors in both the LV HSS charging switch and LV power switch provides a low impedance path for charging the inductor when battery voltage is low.

During phase 1 and phase 2, SR driver 108 in both voltage converters 600 and 700 operate similarly to SR driver 108 in voltage converter 300 described above. Specifically, in phase 1, SR driver 108 is controlled by PWM driver 112 to apply a GND potential to the gate of SR transistor 166, effectively turning transistor 166 off while the inductor is charging. In phase 2, SR driver 108 is controlled by PWM driver 112 to apply Vout to the gate of SR transistor 166, effectively turning transistor 166 on to discharge the inductor.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A voltage converter comprising:
a power switch, coupled between a source of battery potential and a source of reference operating potential, the power switch having respective charging and discharging control terminals configured to receive respective charging and discharging control signals, and an output terminal;
an inductor connected in series with a capacitor, the series connected inductor and capacitor being coupled between the output terminal of the power switch and the source of reference operating potential;
a charging switch having an output terminal coupled to the charging control terminal of the power switch;
a discharging switch having an output terminal coupled to the discharging control terminal of the power switch;
a pulse width modulation (PWM) controller controlling the charging switch and discharging switch;
a feedback loop directly connecting a node at which the capacitor and inductor are connected to the power switch, charging switch and discharging switch exclusive of the PWM controller,
wherein during a charging phase, the charging switch electrically couples the capacitor to the charging control terminal of the power switch, whereby the power switch charges the inductor, and
wherein during a discharging phase, the discharging switch electrically couples the capacitor to the discharging control terminal of the power switch, whereby the power switch discharges the inductor.

2. The voltage converter of claim 1, wherein
the power switch includes a charging cascode switch and a discharging cascode switch having respective charging and discharging control terminals connected to the feedback loop.

3. The voltage converter of claim 1, further comprising:
a voltage regulator circuit having an output terminal coupled to the capacitor, whereby the voltage regulator is turned on during a pre-charging phase to charge the capacitor to a predetermined value, and the power switch is turned off.

4. The voltage converter of claim 3, further comprising:
a regulator power switch for turning off the voltage regulator when the capacitor voltage reaches the predetermined value.

5. The voltage converter of claim 3, further comprising:
an isolation switch for, during the charging phase, routing the electrical current flowing through the charging switch through the feedback loop to the capacitor, the isolation switch blocking the electrical current from flowing through the voltage regulator circuit.

6. The voltage converter of claim 3, further comprising:
an isolation switch for, during the discharging phase, routing electrical current flowing through the capacitor through the feedback loop to the discharging switch, the isolation switch blocking the electrical current from flowing through the voltage regulator circuit.

7. A voltage converting method of operating a voltage converter, the voltage converter comprising a charging switch, a discharging switch, a power switch coupled between a source of battery potential and a source of reference operating potential, a series-connected inductor and capacitor coupled between the power switch and the source of reference operating potential, a pulse width modulation (PWM) controller controlling the charging switch and discharging switch, and a feedback loop coupling the charging switch, the discharging switch and the power switch to a node at which the capacitor is connected to the inductor exclusive of the PWM controller, the voltage converting method comprising:
applying, exclusive of the PWM controller, via the feedback loop and during a charging phase, a capacitor voltage from the capacitor directly to a charging control terminal of the power switch, causing the power switch to apply a charging potential from the source of battery potential to the inductor; and
applying, exclusive of the PWM controller, via the feedback loop and during a discharging phase, the capacitor voltage from the capacitor directly to a discharging control terminal of the power switch, causing the power switch to apply a discharging potential from the source of reference operating potential to the inductor.

8. The method of claim 7, further comprising the steps of:
alternately applying the charging and discharging potentials to the inductor responsive to an error signal representing a difference between the capacitor voltage and a reference voltage.

9. The method of claim 7, further comprising the steps of:
routing electrical current, flowing from the charging switch, through the feedback loop to a load coupled to the capacitor; and
producing by the capacitor voltage, electrical current flowing through the discharging switch via the feedback loop.

10. The method of claim 7 wherein the voltage converter further includes a start-up regulator having an output terminal connected to the feedback loop, the method further comprising:
applying potentials to the charging and discharging control terminals of the power switch to isolate the inductor from the charging and discharging potentials;
applying power to the startup regulator; and
pre-charging the output capacitor to a predetermined voltage responsive to the predetermined voltage provided by the startup regulator.

11. The method of claim 10, further comprising the steps of:
turning off the power to the startup regulator when the capacitor voltage reaches the predetermined voltage; and
applying the predetermined voltage from the capacitor to the charging and discharging control terminals of the power switch.

12. A voltage converter comprising:
a power switch, coupled between a source of battery potential and a source of reference operating potential, the power switch having respective charging and discharging control terminals configured to receive respective charging and discharging control signals, and an output terminal;
an inductor connected in series with a capacitor, the series connected inductor and capacitor being coupled between the output terminal of the power switch and the source of reference operating potential;
a low voltage charging switch having an output terminal coupled to the charging control terminal of the power switch;
a high voltage charging switch having an output terminal coupled to the charging control terminal of the power switch;
a discharging switch having an output terminal coupled to the discharging control terminal of the power switch;
a PWM controller coupled to control terminals of the low voltage and high voltage charging switches, the controller being coupled to the source of battery potential for controlling the low and high voltage charging switches; and
a feedback loop directly connecting the power switch, low voltage charging switch, high voltage charging switch and discharging switch to a node at which the capacitor is connected to the inductor exclusive of the PWM controller,
wherein, during a low voltage charging phase, when a battery potential provided by the source of battery potential is determined by the PWM controller to be less than or equal to a predetermined threshold, the low voltage charging switch couples the source of reference operating potential to the charging control terminal of the power switch, whereby the power switch charges the inductor,
wherein, during a high voltage charging phase, when the battery potential is determined by the PWM controller to be greater than the predetermined threshold, the high voltage charging switch couples the capacitor, via the feedback loop, to the charging control terminal of the power switch, whereby the power switch charges the inductor, and
wherein, during a discharging phase, the discharging switch couples the capacitor, via the feedback loop, to the discharging control terminal of the power switch, whereby the power switch discharges the inductor.

13. The voltage converter of claim 12, further comprising:
a voltage regulator circuit having an output terminal coupled to the capacitor;
wherein, during a pre-charging phase, the voltage regulator is turned on to charge the capacitor to a predetermined value, and the power switch, low voltage charging switch, high voltage charging switch and discharging switch are turned off, and
wherein when the capacitor voltage reaches the predetermined value, the voltage regulator is turned off and the power switch, low voltage charging switch, high voltage charging switch and discharging switch are turned on.

14. The voltage converter of claim 12, wherein the low voltage charging switch has a lower impedance than the high voltage charging switch.

15. The voltage converter of claim 12, wherein
the power switch includes a charging cascode switch and a discharging cascode switch having respective charging and discharging control terminals connected to the feedback loop.

16. The voltage converter of claim 12, further comprising:
a battery monitor coupled to the battery for determining if the battery voltage is less than or equal to a predetermined value and for providing a control signal to the PWM controller to control the low voltage charging switch and the high voltage charging switch.

17. The voltage converter of claim 16, wherein:
the battery monitor is coupled to the PWM controller,
when the battery voltage is less than or equal to the predetermined value, the PWM controller controls the low voltage charging switch to couple the source of reference operating potential to the charging control terminal of the power switch, and
when the battery voltage is greater than the predetermined value, the PWM controller controls the high voltage charging switch to couple the capacitor to the charging control terminal of the power switch.

18. The voltage converter of claim 16, further comprising:
a selector switch for controlling the low voltage charging switch and the power switch, the selector switch coupled to the battery monitor,
when the battery voltage is less than or equal to the predetermined value, the selector switch controls the low voltage charging switch and power switch to turn fully on, and
when the battery voltage is greater than the predetermined value, the selector switch controls the low voltage charging switch and power switch to turn partially on.

19. The voltage converter of claim 16, further comprising:
wherein the PWM controller selectively applies PWM signals to the control terminals of the low voltage charging switch and high voltage charging switch responsive to the output of the battery monitor to control the charging of the capacitor.

20. The voltage converter of claim 16, wherein the power switch includes
a low voltage power switch and high voltage power switch having respective charging control terminals, and respective output terminals coupled to the inductor.

21. The voltage converter of claim 20, wherein
the output terminal of the low voltage charging switch is coupled to the charging control terminal of the low voltage power switch, and the output terminal of the high voltage charging switch is coupled to the charging control terminal of the high voltage power switch.

22. The voltage converter of claim 21, wherein
when the battery voltage is less than or equal to the predetermined value, the PWM controller controls the low voltage charging switch to control the low voltage power switch to couple the inductor to the source of battery potential,
when the battery voltage is greater than the predetermined value, the PWM controller controls the high voltage charging switch to control the high voltage power switch to couple the inductor to the source of battery potential, and
wherein the low voltage power switch has a lower impedance than the high voltage power switch.

* * * * *